(12) United States Patent
Kang et al.

(10) Patent No.: US 7,830,660 B2
(45) Date of Patent: Nov. 9, 2010

(54) COOLING UNIT AND DISPLAY APPARATUS HAVING THE SAME

(75) Inventors: Joon Kang, Seoul (KR); Jin-hyun Cho, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 71 days.

(21) Appl. No.: 12/132,785

(22) Filed: Jun. 4, 2008

(65) Prior Publication Data

US 2009/0086430 A1   Apr. 2, 2009

(30) Foreign Application Priority Data

Sep. 27, 2007   (KR) ..................... 10-2007-0097396

(51) Int. Cl.
*H05K 7/20* (2006.01)
*G06F 1/20* (2006.01)

(52) U.S. Cl. ............. 361/695; 361/679.48; 361/679.49; 361/690; 361/692; 361/694; 361/697; 361/704; 165/185; 313/46; 345/905; 348/748; 349/161

(58) Field of Classification Search ................................
361/679.46–679.52, 679.54, 690, 692, 694–695, 361/697, 700, 702, 704, 709, 719; 165/80.2–80.5, 165/104.33, 185; 174/15.2, 16.1, 16.3; 312/223.1–223.2, 312/236; 313/46, 582; 345/60, 905; 348/748–749; 349/161

See application file for complete search history.

(56) References Cited

U.S. PATENT DOCUMENTS

| | | | | |
|---|---|---|---|---|
| 4,557,095 A | * | 12/1985 | Rice et al. ....................... 52/473 |
| 4,652,101 A | * | 3/1987 | Grunwald .................... 353/122 |
| 4,904,079 A | * | 2/1990 | Yoshimura et al. .......... 353/122 |
| 5,259,816 A | * | 11/1993 | Ke et al. ..................... 454/244 |
| 5,297,005 A | * | 3/1994 | Gourdine .................... 361/697 |
| 5,422,787 A | * | 6/1995 | Gourdine .................... 361/697 |
| 5,762,550 A | * | 6/1998 | Brunner ...................... 454/184 |

(Continued)

FOREIGN PATENT DOCUMENTS

JP     4-320095     11/1992

(Continued)

*Primary Examiner*—Jayprakash N Gandhi
*Assistant Examiner*—Robert J Hoffberg
(74) *Attorney, Agent, or Firm*—Stanzione & Kim, LLP

(57) ABSTRACT

A cooling unit to cool the display apparatus including a heat generating unit to generate heat and a casing to accommodate the heat generating unit, the cooling unit includes a cooling fan to generate air flow; a duct which is coupled with the casing and forms a cooling path to connect the cooling fan and the heat generating unit; an inlet portion which is provided to one side of the casing to communicate with the duct; an inlet grill which is provided in the inlet portion to guide air to be inhaled in a direction inclined to a rear surface of the casing; an outlet portion which is provided to an other side of the casing to communicate with the duct, being spaced from the inlet portion; and an outlet grill which is provided in the outlet portion to guide air to be exhaled in a direction inclined to a rear surface of the casing, wherein the exhaled direction provided by the outlet grill is different from the air-inhaling direction provided by the inlet grill. With this configuration, the cooling path is effectively provided to enhance cooling efficiency and thermal reliability.

18 Claims, 10 Drawing Sheets

U.S. PATENT DOCUMENTS

| | | | |
|---|---|---|---|
| 5,912,803 A * | 6/1999 | Dahl et al. | 361/704 |
| 6,401,463 B1 * | 6/2002 | Dukhan et al. | 62/5 |
| 6,680,843 B2 * | 1/2004 | Farrow et al. | 361/679.02 |
| 6,687,123 B2 * | 2/2004 | Kitahara | 361/695 |
| 6,704,196 B1 * | 3/2004 | Rodriguez et al. | 361/679.33 |
| 7,120,015 B2 * | 10/2006 | Furuya | 361/679.48 |
| 7,405,930 B2 * | 7/2008 | Hongo et al. | 361/679.48 |
| 7,522,416 B2 * | 4/2009 | Kim et al. | 361/695 |
| 2005/0007737 A1 * | 1/2005 | Chen | 361/690 |
| 2005/0276018 A1 * | 12/2005 | Moore et al. | 361/695 |
| 2006/0002081 A1 * | 1/2006 | Hongo et al. | 361/691 |
| 2006/0164804 A1 * | 7/2006 | Kim et al. | 361/688 |
| 2008/0165496 A1 * | 7/2008 | Kang et al. | 361/692 |
| 2009/0244827 A1 * | 10/2009 | Rehmann et al. | 361/679.47 |

FOREIGN PATENT DOCUMENTS

| | | |
|---|---|---|
| JP | 2005-156748 | 6/2005 |
| JP | 2006162641 A * | 6/2006 |
| KR | 2006-70176 | 6/2006 |

* cited by examiner

COOLING UNIT AND DISPLAY APPARATUS HAVING THE SAME

CROSS-REFERENCE TO RELATED APPLICATIONS

This application claims priority under 35 U.S.C. §119(a) from Korean Patent Application No. 10-2007-0097396, filed on Sep. 27, 2007 in the Korean Intellectual Property Office, the disclosure of which is incorporated herein in its entirety by reference.

BACKGROUND OF THE INVENTION

1. Field of the Invention

The present general inventive concept relates to a cooling unit which has improved cooling efficiency, and a display having the same.

2. Description of the Related Art

In general, a display apparatus such as a television, a monitor for a computer, or the like includes a display panel, a heat generating unit such as a printed circuit board which generates heat while driving the display panel, and a casing which forms an outside appearance.

Recently, a digital information display (DID) has been actively developed meeting consumer's demand. The DID publicly provides various contents including characters and moving pictures, and thus, is generally called a public display. The DID has been under development in various types of products.

A display apparatus including the DID may be installed under various environments. Particularly, if the display apparatus is installed outside, the display apparatus is typically equipped with a protection cover or installed on an installation surface like a wall. If the display apparatus is equipped with the protection cover, the protection cover should be installed so that the protection cover may not be spaced too far apart from the casing. If the display apparatus is installed on the installation surface, the display apparatus should not greatly protrude from the installation surface.

However, if a distance or a space between the display apparatus and the protection cover or the installation surface is too narrow, improving cooling efficiency of the display apparatus is difficult, thereby lowering thermal reliability thereof. Thus, an element having a relatively high heating value may affect other elements. Further, characteristics like brightness of the display apparatus may be lowered.

SUMMARY OF THE INVENTION

The present general inventive concept provides a cooling unit which can effectively provide a cooling path to enhance cooling efficiency and thermal reliability, and a display apparatus having the same.

The present general inventive concept also provides a cooling unit which can independently cool an element having a relatively high heating value to minimize a thermal influence on other elements, and a display apparatus having the same.

The present general inventive concept also provides a cooling unit which can provide a cooling path so that air flowing in the cooling path and air flowing out of the cooling path may not be mixed with each other, and a display apparatus having the same.

The present general inventive concept also provides a cooling unit which can provide a slim structure, and a display apparatus having the same.

Additional aspects of the present general inventive concept will be set forth in part in the description which follows and, in part, will be obvious from the description, or may be learned by practice of the present general inventive concept.

The foregoing and/or other aspects and utilities of the present general inventive concept can be achieved by providing a cooling unit to cool a display apparatus including a heat generating unit to generate heat and a casing to accommodate the heat generating unit, the cooling unit including a cooling fan to generate air flow, a duct which is coupled with the casing and forms a cooling path to connect the cooling fan and the heat generating unit, an inlet portion which is provided at one side of the casing to communicate with the duct, an inlet grill which is provided in the inlet portion to guide air to be inhaled in a direction inclined to a rear surface of the casing, an outlet portion which is provided at an other side of the casing to communicate with the duct, being spaced from the inlet portion, and an outlet grill which is provided in the outlet portion to guide air to be exhaled in a direction inclined to a rear surface of the casing, wherein the exhaled direction provided by the outlet grill is different from the air-inhaling direction provided by the inlet grill.

An inclination angle between the inlet grill and the rear surface of the casing may be within a range of 40° to 50° to inhale air from an outside to an inside of the casing in an upward inclined direction, and an inclination angle between the outlet grill and the rear surface of the casing may be within a range of 40° to 50° to exhale air from inside to outside of the casing in an upward inclined direction.

The cooling unit may include a heat transfer unit which is coupled with the heat generating unit and the duct and transfers the heat from the heat generating unit to the duct.

The heat transfer unit may include a contact member which is coupled with the heat generating unit to transfer the heat from the heat generating unit, and a heat radiating member which is coupled with the contact member and is disposed in the duct to radiate the heat from the contact member.

The cooling path of the duct may be arranged vertically to the casing, the inlet portion being disposed in a lower portion of the duct, and the outlet portion being disposed in an upper portion of the duct.

The cooling path of the duct may be arranged horizontally to the casing, the inlet portion being disposed in one of left and right sides of the duct, and the outlet portion being disposed in an other of the left and the right sides of the duct.

The foregoing and/or other aspects and utilities of the general inventive concept may also be may be achieved by providing a display apparatus including a heat generating unit to generate heat, a display panel which forms an image, a casing to accommodate the heat generating unit and the display panel, and a cooling unit to cool the heat generating unit, the cooling unit including a cooling fan to generate air flow, a duct which is coupled with the casing and forms a cooling path to connect the cooling fan and the heat generating unit, an inlet portion which is provided to one side of the casing to communicate with the duct, an inlet grill which is provided in the inlet portion to guide air to be inhaled in a direction inclined to a rear surface of the casing, an outlet portion which is provided to the other side of the casing to communicate with the duct, being spaced from the inlet portion, and an outlet grill which is provided in the outlet portion to guide air to be exhaled in a direction inclined to the rear surface of the casing, wherein the exhaled direction provided by the outlet grill is different from the air-inhaling direction provided by the inlet grill.

The cooling unit may further include a heat transfer unit which is coupled with the heat generating unit and the duct and transfers the heat from the heat generating unit to the duct.

The heat transfer unit may include a contact member which is coupled with the heat generating unit to transfer the heat from the heat generating unit, and a heat radiating member which is coupled with the contact member and is disposed in the duct to radiate the heat from the contact member.

The cooling path of the duct may be arranged vertically to the duct, the inlet portion being disposed in a lower portion of the duct, and the outlet portion being disposed in an upper portion of the duct.

The cooling path of the duct may be arranged horizontally to the casing, the inlet portion being disposed in one of left and right sides of the duct, and the outlet portion being disposed in an other of the left and the right sides of the duct.

The cooling unit may be provided in a plurality.

The display apparatus may include a digital information display (DID) having a network function.

The heat generating unit may include at least one of a CPU and a chip.

The heat generating unit may be plurally provided in the rear surface of the casing, each having a different heating value, the heat generating unit having a relatively high heating value among the heat generating units is disposed in a lower portion of the display panel, and the heat generating unit having a relatively low heating value among the heat generating units is disposed in an upper portion of the display panel.

The foregoing and/or other aspects and utilities of the general inventive concept may also be may be achieved by providing a cooling unit usable with a display apparatus including a duct to form a cooling path between an inlet grill and an outlet grill of a casing of the display apparatus, a heat transfer unit disposed in the duct to transfer heat in the cooling path, and a cooling fan disposed in the duct to generate airflow along the cooling path, wherein the outlet grill guides air in a first direction and the inlet grill guides air in a second direction not parallel to the first direction.

The duct may include an opening, and the heat transfer unit receives the heat from a heat generating unit of the display apparatus through the opening.

The inlet grill and the outlet grill may guide air in a direction not parallel with a rear surface of the casing.

The foregoing and/or other aspects and utilities of the general inventive concept may also be may be achieved by providing a display apparatus including a display panel unit, a heat generating unit disposed on the display panel unit and including at least one of a central processing unit (CPU), a Northbridge, a Southbridge and a printed circuit board (PCB), a casing to accommodate the display panel unit and the heat generating unit, and a cooling unit including a duct to form a cooling path between an inlet grill and an outlet grill of a casing of the display apparatus, a heat transfer unit disposed in the duct to transfer heat in the cooling path, and a cooling fan disposed in the duct to generate airflow along the cooling path, wherein the outlet grill guides air in a first direction and the inlet grill guides air in a second direction not parallel to the first direction.

BRIEF DESCRIPTION OF THE DRAWINGS

The above and/or other aspects of the present general inventive concept will become apparent and more readily appreciated from the following description of the exemplary embodiments, taken in conjunction with the accompanying drawings, in which.

DETAILED DESCRIPTION OF THE PREFERRED EMBODIMENTS

Figure 1:
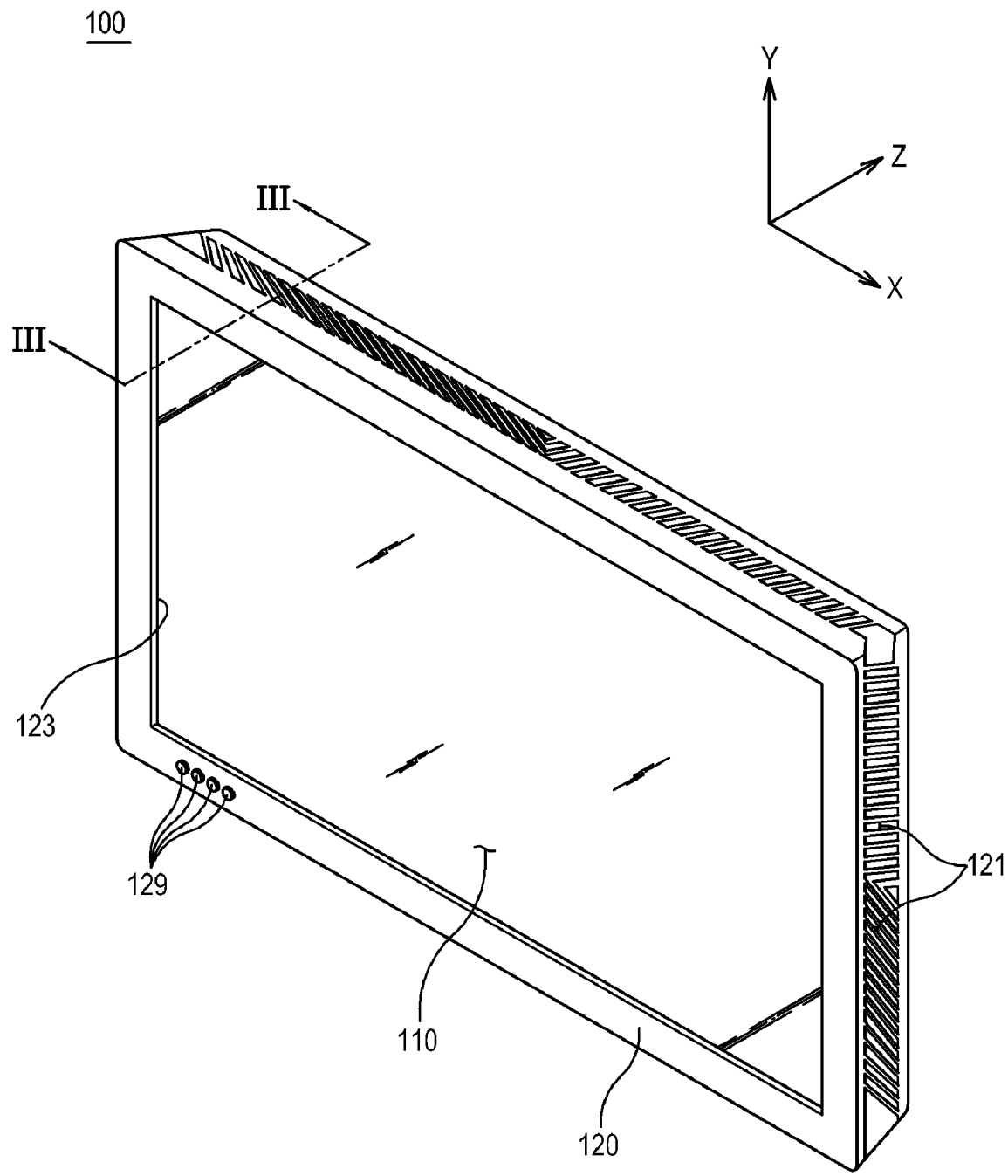
FIG. 1 is a perspective view of a display apparatus according to an exemplary embodiment of the present general inventive concept.

Reference will now be made in detail to embodiments of the present general inventive concept, examples of which are illustrated in the accompanying drawings, wherein like reference numerals refer to like elements throughout. The exemplary embodiments are described below so as to explain the present general inventive concept by referring to the figures.

Referring to FIGS. 1 through 7, a display apparatus 100 according to an exemplary embodiment of the present general inventive concept includes a display panel 110; a casing 120; and a cooling unit 130.

The display apparatus 100 further includes a heat generating unit 125 which is coupled with a rear portion of the display panel 110 and performs various functions such as driving the display panel 110 or providing network information.

The display apparatus 100 may be arranged in a landscape direction, as illustrated in FIG. 1, or may be arranged in a portrait direction where necessary. Hereinafter, it is assumed that the display apparatus is arranged in the landscape direction for the convenience of description.

The display apparatus 100 may have a network function. The display apparatus 100 may be provided in a plurality, which may be connected on a network by a single management server.

To this end, a CPU having high capacity, that is, a computer having high capacity is required, to generate a lot of heat, and thus, requires a cooling unit having high cooling efficiency.

Such a display apparatus is generally installed on an installation surface like a wall W (refer to FIG. 9), or equipped with a protection cover. Hereinafter, the case that the display is installed on the wall W will be described by way of example.

Figure 3:
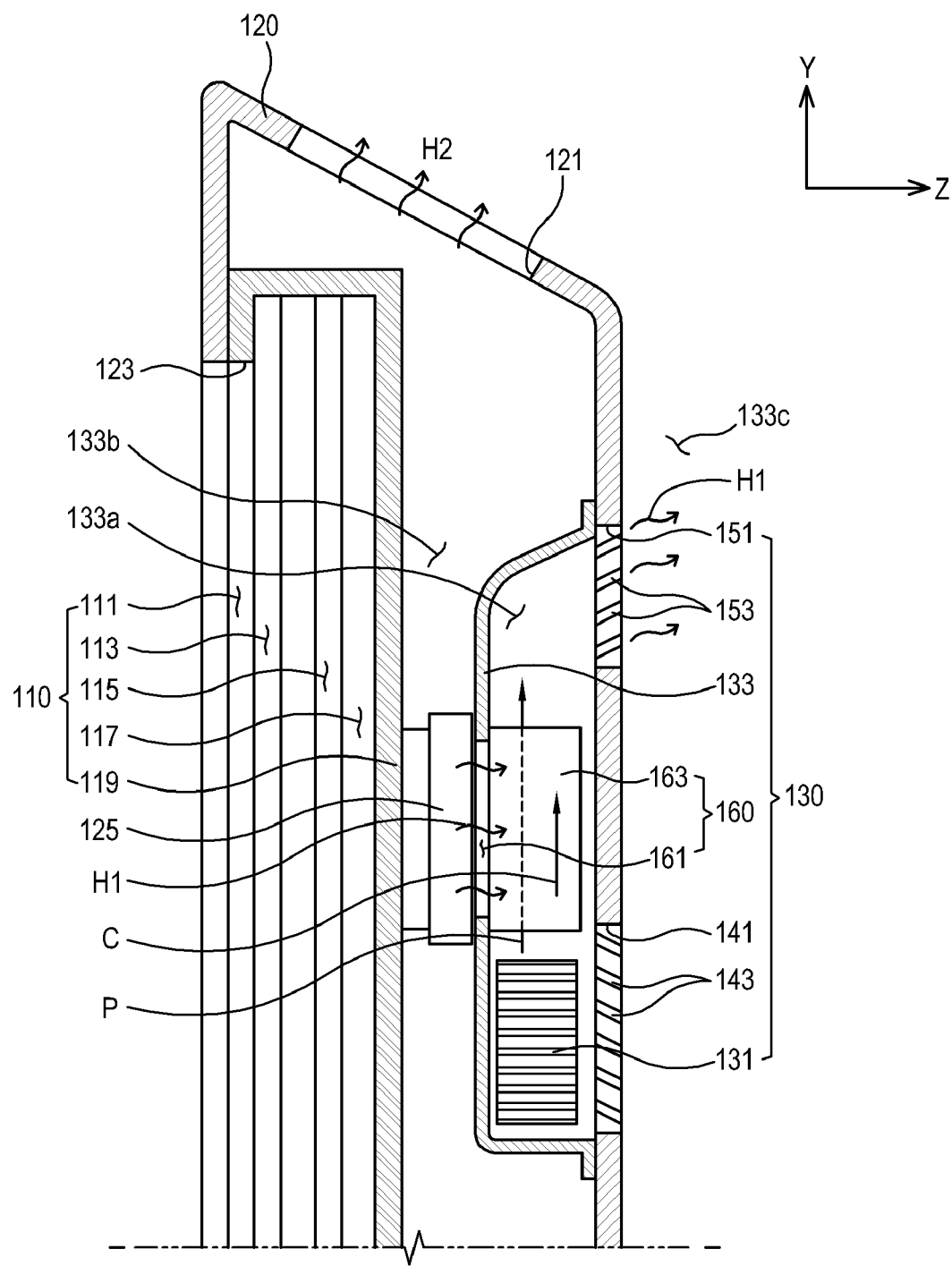
FIG. 3 is section view of the display apparatus, taken along line III-III in FIG. 1.

Referring to FIG. 3, the display panel 110 includes a chassis 119 having an opening 123; and a display portion 111 which is accommodated in the chassis 119 and forms an image. The display panel 110 may further include a film portion 113 which is disposed in back of the display portion 111; a light source unit 115 which is disposed in back of the film portion 113; and a reflection portion 117 which is disposed adjacent to the light source unit 115.

The display portion 111 may include a thin film transistor substrate (not illustrated) on which a thin film transistor is formed; and a color filter substrate (not illustrated) which is disposed opposite to the thin film transistor substrate; and a liquid layer (not illustrated) which is interposed therebetween. The display portion 111 is made of a non light emitting element, which requires light from the light source unit 115 for image forming.

The film portion 113 may include a diffusion film (not illustrated); a prism film (not illustrated); and a passivation film (not illustrated).

The light source unit 115 may include a plurality of lamps (not illustrated) which are arranged in parallel.

The reflection portion 117 is disposed adjacent to the light source unit 115 and reflects the light from the light source unit 115 toward the diffusion film of the film portion 113.

The chassis 119 accommodates and supports the display portion 111, the film portion 113 and the light source unit 115.

The casing 120 forms an outside appearance of the display apparatus 100. In the casing 120 is formed a plurality of slits 121 for airflow to cool the display panel 110. The slits 121 are formed over a side wall of the casing 120 to output heat $H_2$.

In a front portion of the casing 120 is formed an opening through which the display portion 111 is exposed, and in a rear portion of the casing 120 are formed an inlet portion 141 and an outlet portion 151 of the cooling unit 130.

In a lower front portion of the casing 120 is provided a switch unit 129 (FIG. 1) to operate the display panel 110, and in a lower rear portion of thereof is provided a terminal portion 127 (FIG. 2) which is connectable to an external power supply or an external terminal for communication.

The display apparatus 100 further includes a control unit to perform various control functions. The control unit 130 includes the heat generating unit 125 to generate heat during an operation thereof.

Figure 8:
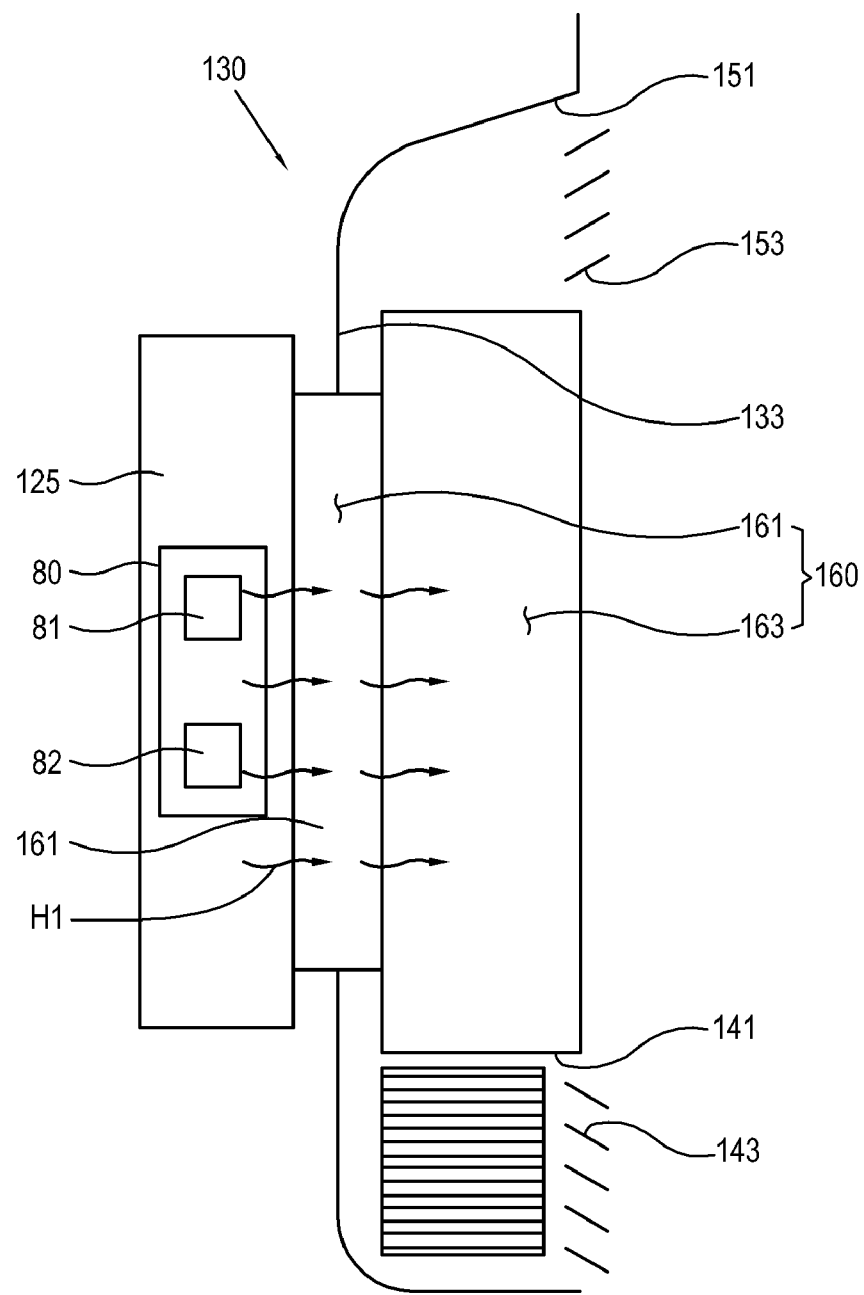
FIG. 8 is a schematic view illustrating a heat transfer process according to an exemplary embodiment of the present general inventive concept.

Referring to FIG. 8, the heat generating unit 125 may include a CPU which is coupled with the display panel 110 or the casing 120, or a chip such as Northbridge 81 and Southbridge 82 which are a type of system controller to connect the CPU to a PCI (Peripheral Component Interconnect) bus. The heat generating unit 125 may further include a printed circuit board 80. The heat may be disposed or transmitted as heat $H_1$ or heat $H_2$. The heat $H_1$ may be transmitted along a path P.

Figure 9:
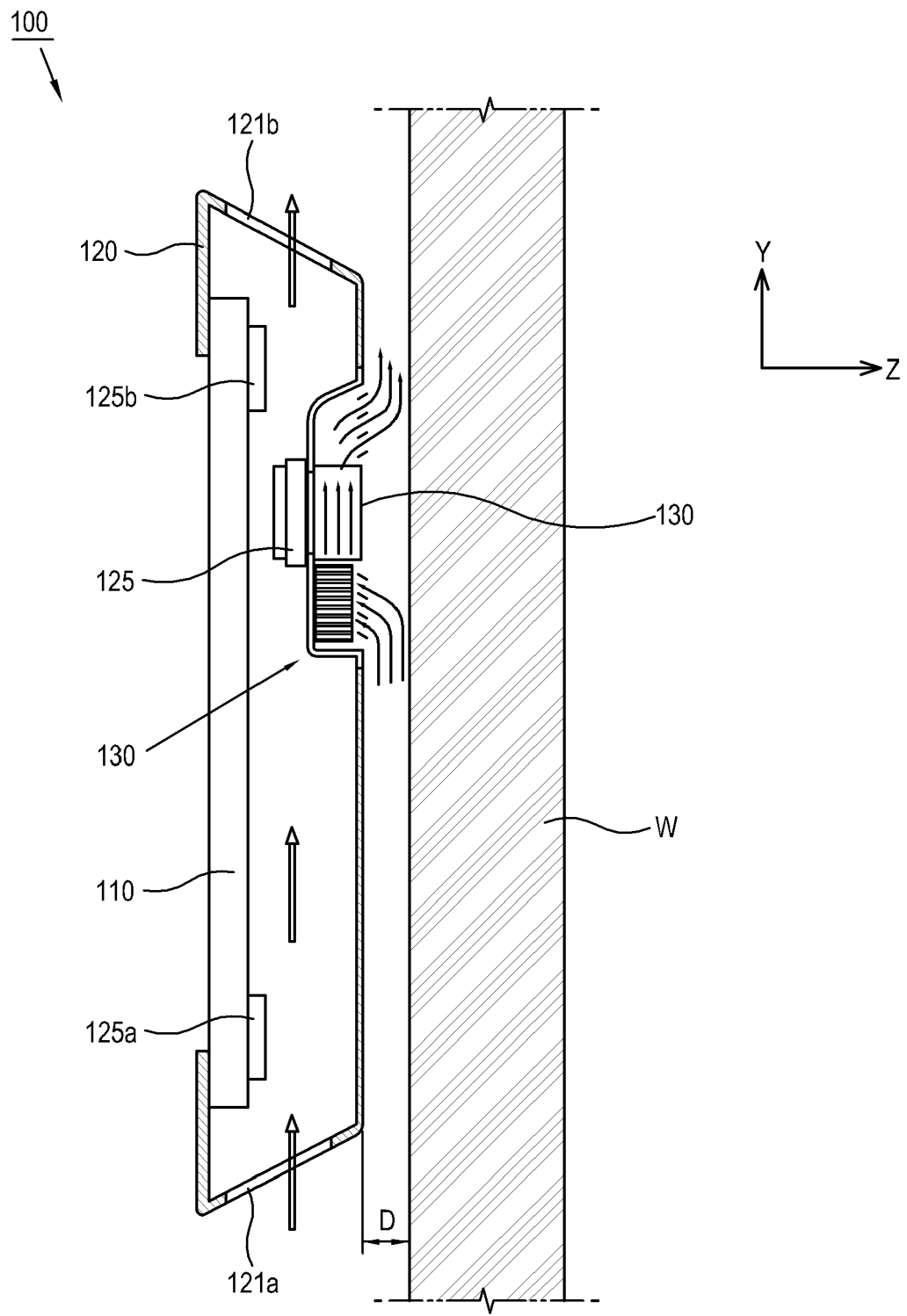
FIG. 9 is a side section view of the display apparatus illustrating air flow.

Referring to FIG. 9, the heat generating unit 125 according to the present embodiment may include all elements to generate heat, or may include some heat generating elements to generate heat greater than a predetermined value. In the latter case, the heat generating unit includes a first heat generating unit 125a having a relatively high heating value; and a second heat generating unit 125b having a relatively low heating value.

As illustrated in FIG. 9, the first heat generating unit 125a may be disposed on a lower rear portion of the display panel 110, the second heat generating unit 125b may be disposed on an upper rear portion of thereof. The first and second heat generating units 125a and 125b may be diagonally arranged as necessary. The first and second heat generating units 125a and 125b may be coupled to the casing 120 as necessary.

As illustrated in FIG. 3, the cooling unit 130 includes a cooling fan 131; a duct 133; the inlet portion 141; and the outlet portion 151. The cooling unit 130 further includes a heat transfer unit 160.

Figure 4:
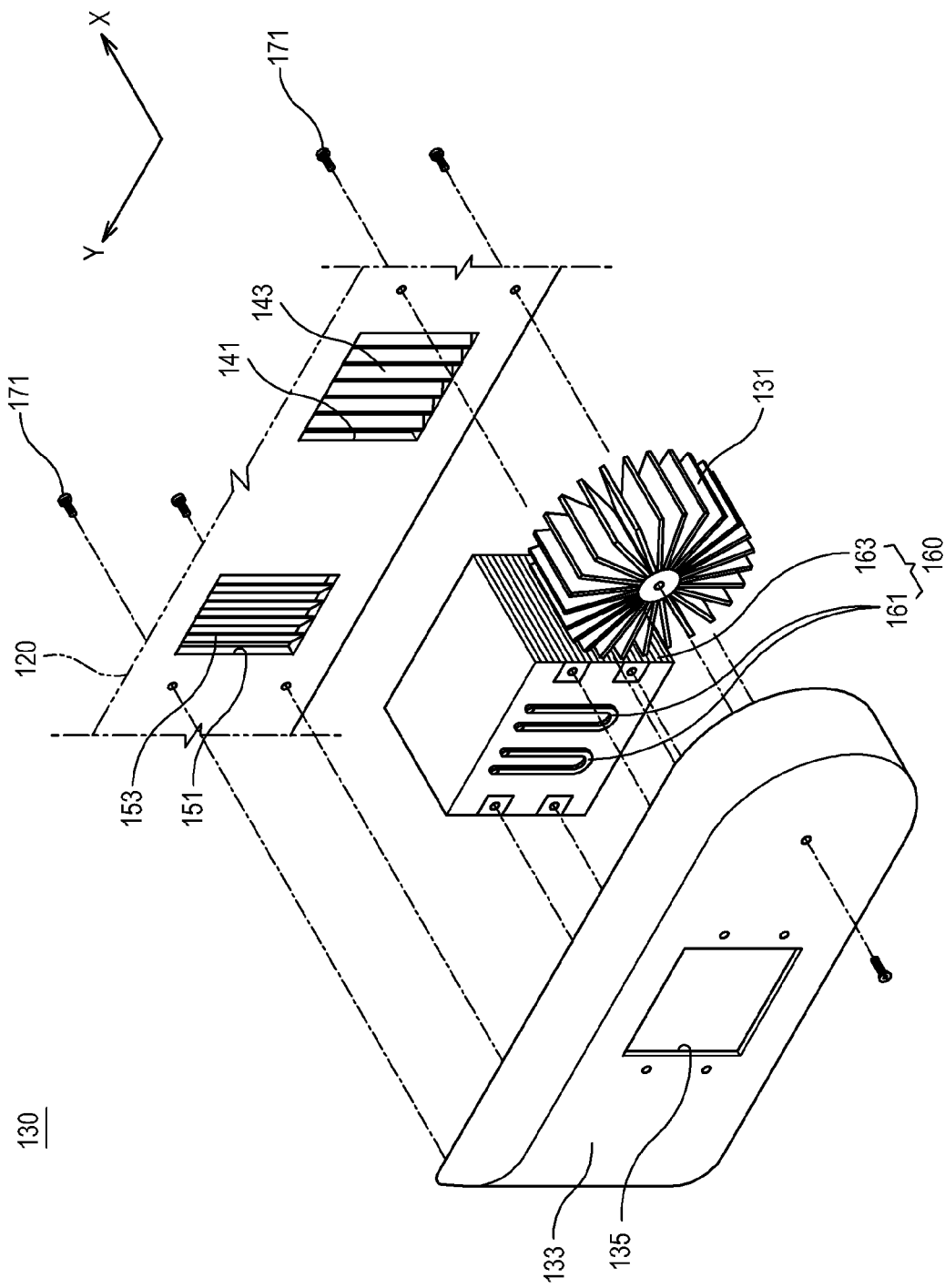
FIG. 4 is an exploded perspective view of a cooling unit in FIG. 3.

The cooling fan 131 generates air flow P, and transmits heat $H_1$ from inside of the casing to the outside of the casing 133c therethrough. The capacity of the cooling fan 131 is determined in consideration of an amount of heat generated from the heat generating unit 125, heat transfer efficiency of the heat transfer unit 160, etc. The cooling fan 131 may have a slim appearance so long as the cooling fan 131 meets the capacity thereof. The cooling fan 131 may be provided as a cross-flow fan as illustrated in FIG. 4, but alternatively, may be provided as an axial-flow fan as necessary.

The duct 133 is coupled with the casing 120 by a screw 171 and forms a cooling path C of air generated from the cooling fan 131. In the duct 133, a heat exchange is generated between air flowing therein and heat transferred from the heat generating unit 125, and then, the air flows outside 133c. The duct 133 has an opening 135 through which the heat transfer unit 160 is coupled to the heat generating unit 125 for heat transfer.

The duct 133 may have a rectangular section, but alternatively, may have various sections as necessary. The size of the duct is determined in consideration of the amount of heat generated from the heat generating unit 125, the capacity of the cooling fan 131, a size of an installation space, etc.

The duct 133 is coupled with the heat transfer unit 160 and the casing 120 so that air generated from the cooling fan 131 may not enter into a space 133b formed by the casing 120 and the display panel 110.

The inlet portion 141 which is formed in the casing 120 communicates with an inlet of the duct 133. An inlet grill 143 is coupled to the inlet portion 141 and is inclined to the casing 120.

The outlet portion 151 which is formed in the casing 120 communicates with an outlet of the duct 133. The outlet portion 151 is spaced apart from the inlet 141. An outlet grill 153 is coupled to the outlet portion 151 and is inclined to the casing 120.

The inlet grill 143 and the outlet grill 153 can minimize resistance to air flowing into or out of the duct 133, to thereby increase cooling efficiency inside the duct 133.

Figure 5:
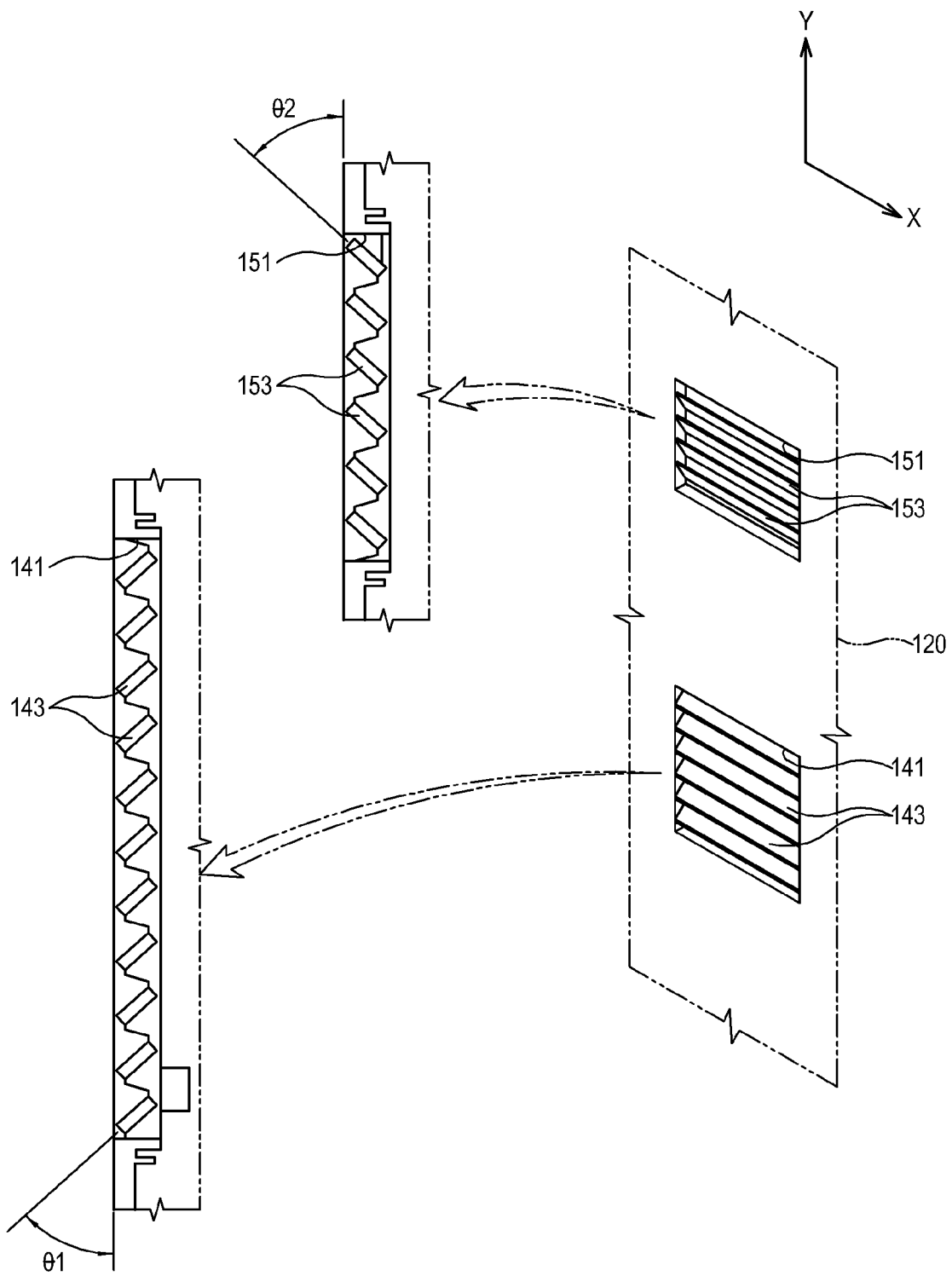
FIG. 5 illustrates an inlet portion and an outlet portion in FIG. 4.

As illustrated in FIG. 5, an inlet inclination angle $\theta1$ between the inlet grill 143 and a rear surface of the casing 120 may be within a range of about to 40° to 50° so as to inhale external air from the outside to the inside of the casing 120 in an upward inclined direction. Alternatively, an outlet inclination angle $\theta2$ between the outlet grill 153 and the rear surface of the casing 120 may be within the range of 40° to 50° in order to exhale internal air from the inside to the outside of the casing 120 in the upward inclined direction. Air flow and cooling efficiency are enhanced within the inclination angle range. Here, if the inlet inclination angle $\theta1$ is positive, the outlet inclination angle $\theta2$ is negative, and vice versa. That is, both the angles $\theta1$ and $\theta2$ have reverse inclination directions. Thus, flowing-in air and flowing-out air do not mixed each other, thereby enhancing cooling efficiency.

The heat transfer unit 160 is coupled with the heat generating unit 125 inside 133a of the duct 133 to transfer heat from the heat H1 generating unit 125 to the inside 133a of the duct 133.

As illustrated in FIG. 4, the heat transfer unit 160 includes a contact member 161 which is coupled with the heat generating unit 125; and a heat radiating member 163 which is coupled with the contact member 161 and radiates heat transferred to the contact member 161 from the heat generating unit 125 to the inside 133a of the duct 133. Referring to FIG. 4, the contact member 161 may include two heat pipes for effective heat transfer, but the number of the heat pipes may be varied as necessary.

Here, the heat pipe near the inlet portion 141 may contact the heat generating unit 125 of high temperature rather than an other heat pipe near the outlet portion 151. That is, the heat transfer unit 160 may have a configuration that heat from the heat generating unit 125 is firstly cooled by flowing-in air of low temperature. Alternatively, the plurality of contact members 161 may be arranged in parallel in the cooling path.

The heat transfer unit 160 may include a heat sink. Accordingly, providing an independent cooling system so that heat from the heat generating unit 125 such as a CPU or a chip like Northbridge and Southbridge having a relatively high heating value does not affect other elements inside the casing 120 is possible.

Figure 2:
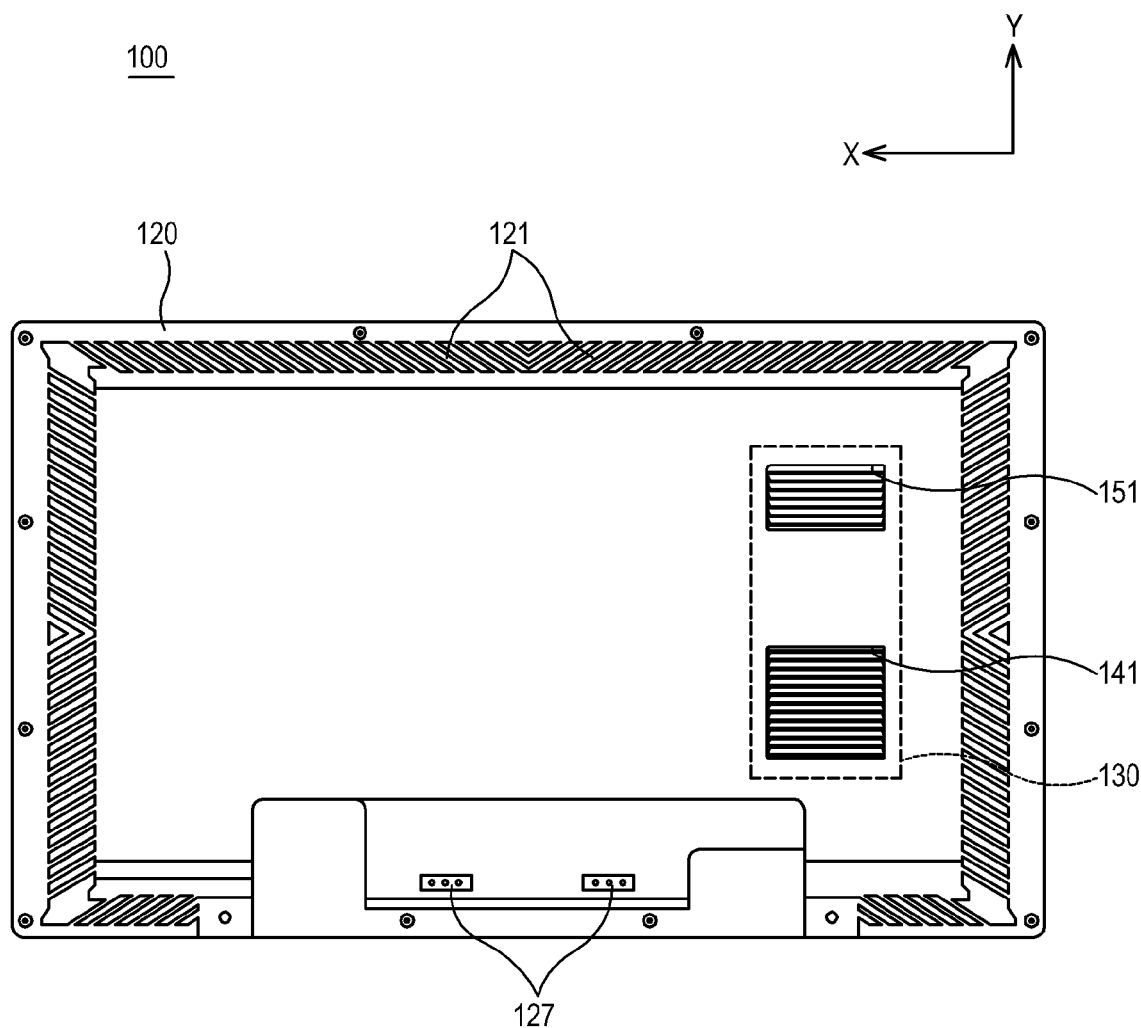
FIG. 2 is a rear view of the display apparatus in FIG. 1.

The cooling unit 130 may be arranged vertically to the casing 120 as illustrated in FIG. 2. In this case, the inlet portion 141 may be disposed in a lower portion of the casing 120 and the outlet portion 151 may be disposed in an upper portion of the casing 120. Accordingly, air flows from the lower portion of the casing 120 to the upper portion thereof inside the duct 133. That is, air flows into the duct 133 in the lower portion of the casing 120, and then, hot air heated by heat exchange flows out of the duct in the upper portion of the casing 120. Thus, flow of air becomes smooth, thereby enhancing cooling efficiency.

Figure 6:
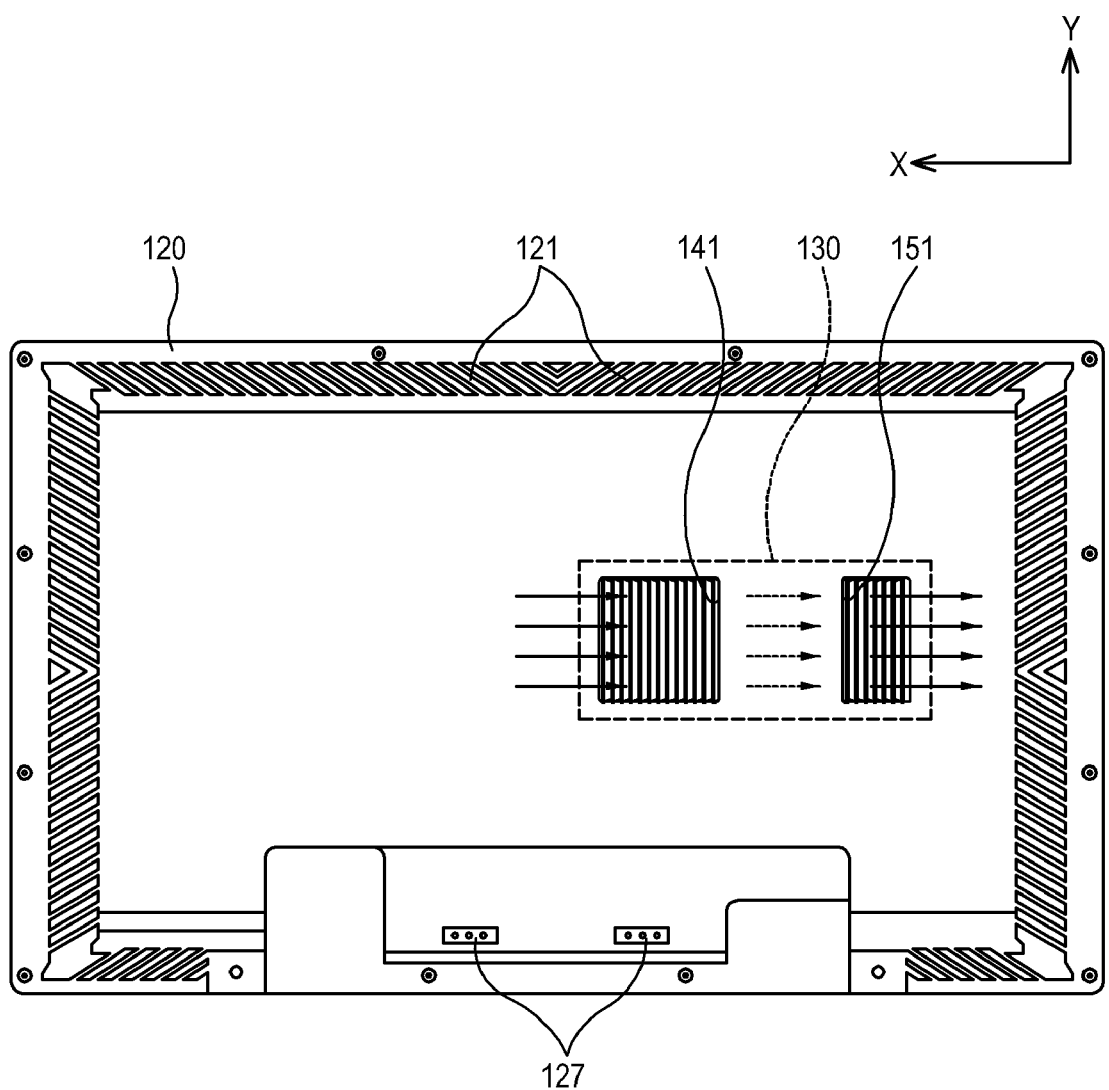
FIG. 6 is a rear view of a display apparatus according to an exemplary embodiment of the present general inventive concept.

Alternatively, the cooling unit 130 may be arranged horizontally to the casing 120 as illustrated in FIG. 6. In this case, the outlet portion 141 may be disposed adjacent to a right edge side of the casing 120.

Figure 7:
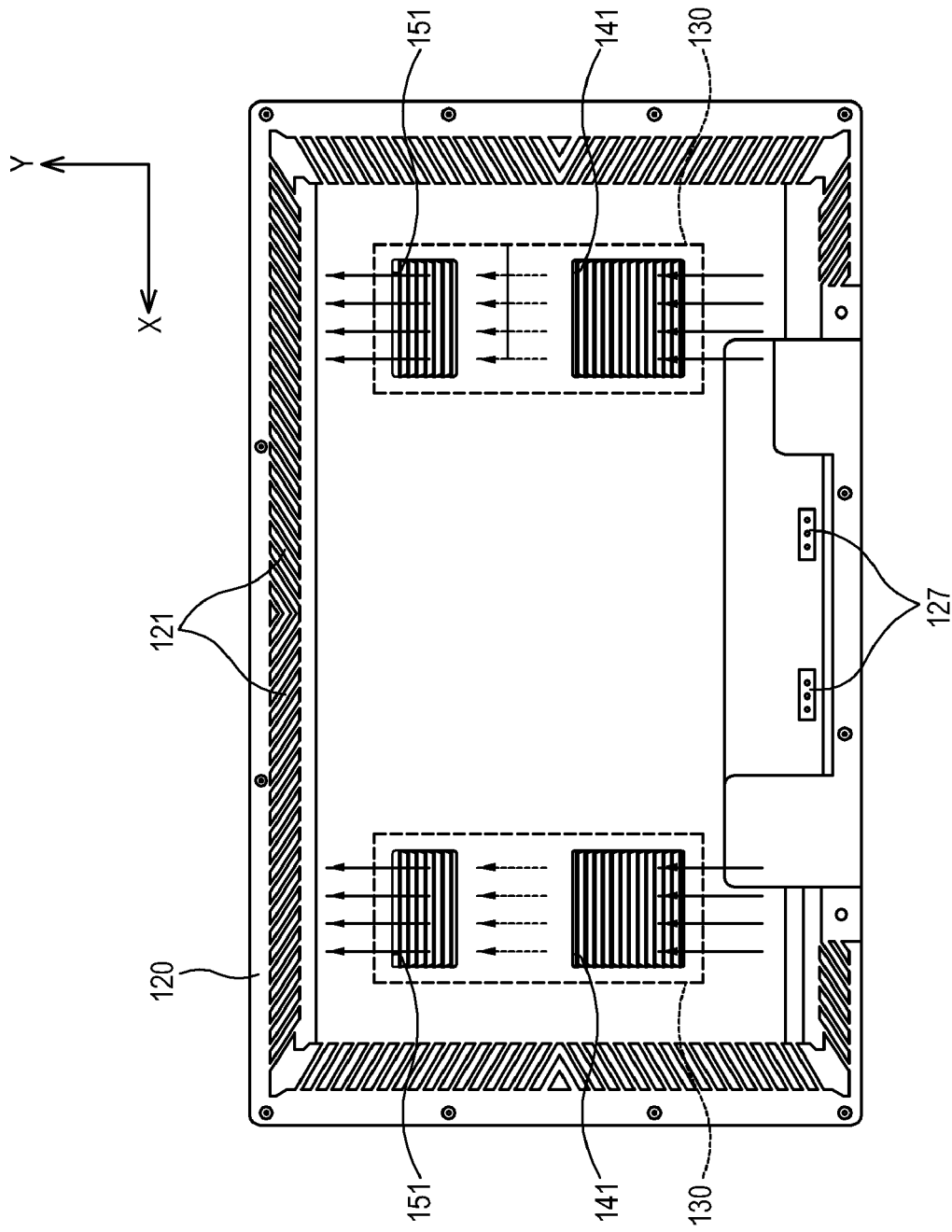
FIG. 7 is a rear view of a display apparatus according to an exemplary embodiment of the present general inventive concept.

The cooling unit 130 may be provided in a plurality as illustrated in FIG. 7 according to a position of the heat generating unit 125.

Hereinafter, an operating process of the cooling unit 130 as configured above will be described with reference to FIGS. 8 and 9.

If power is supplied to the display apparatus 100, the display panel 110 operates to perform various functions. During the operation, the heat generating unit 125 generates heat as illustrated in FIG. 8. The generated heat is transferred to the heat transfer unit 160 and is radiated outside through the duct 133.

As illustrated in FIG. 9, the casing 120 of the display apparatus 100 which is installed on the installation surface W is spaced by a distance D from the installation surface W.

If the fan 131 operates, outside air flows into the inlet portion 141 and flows outside through the outlet portion 151, through heat exchange with the heat transfer unit 160. During this process, air can flow in and out through the inlet grill 143 and the outlet grill 153, with flow resistance being minimized in a narrow space between the casing 120 and the installation surface W.

Alternatively, as illustrated in FIG. 9, the heat generating units 125a and 125b which are provided on the rear of the display panel 110 may be arranged in a separate cooling path (refer to an arrow in FIG. 9) which is formed by slits 121a and 121b formed in side walls of the casing 120. In this case, air flow may be formed by a fan (not illustrated), or may be formed by convection. That is, air is flowed in through the lower slit 121a and cools the heat generating unit 125a of relatively high temperature, and then, passes through the heat generating unit 125b of relatively low temperature and flows outside through the upper slit 121b. In this way, the heat generating units 125a and 125b can be cooled effectively.

Figure 10:
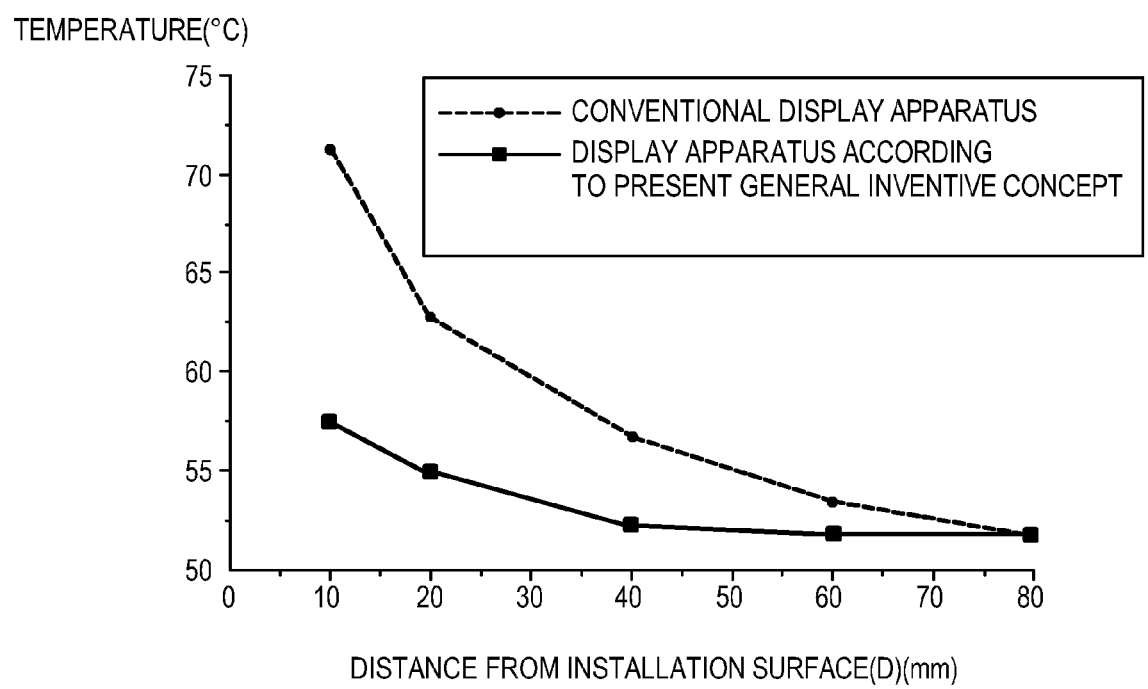
FIG. 10 is a graph illustrating cooling performance of the display apparatus according to an embodiment of the present general inventive concept compared with a conventional display apparatus

FIG. 10 illustrates cooling performance of the display apparatus 100 according to the present embodiment in comparison with the conventional display apparatus.

Here, a constant-pressure centrifugal fan is employed as the cooling fan 131 to overcome pressure drop and to improve cooling performance.

In FIG. 10, an abscissa represents the distance D (mm) between the casing 120 and the installation surface W, and an ordinate represents the temperature (° C.) of the CPU at the heat generating unit 125.

As illustrated, in the display apparatus according to the present embodiment, the temperature rise of the heat generating unit 125 is within approximately 6° C. according as the distance D decreases.

Contrarily, in the conventional display apparatus, according as the distance D decreases, the temperature rise gradually increases to approximately 20° C.

Accordingly, in the display apparatus according to the present general inventive concept, the distance D can be significantly decreased compared with the conventional display apparatus, thereby making the outside appearance thereof slim.

As described above, according to various embodiments of the present general inventive concept, a cooling path can be effectively formed, thereby enhancing cooling efficiency and thermal reliability.

Further, a heat generating unit having a relatively high heating value can be independently cooled, thereby minimizing thermal influence on other elements.

Furthermore, a cooling path can be formed so that flowing-in air and flowing-out air may not be mixed with each other.

In addition, an outside appearance of the display apparatus can be made slim.

Although various exemplary embodiments of the present general inventive concept have been illustrated and described, it will be appreciated by those skilled in the art that changes may be made in these embodiments without departing from the principles and spirit of the general inventive concept, the scope of which is defined in the appended claims and their equivalents.

What is claimed is:

1. A cooling unit to cool a display apparatus comprising a heat generating unit to generate heat and a casing having an inner space to accommodate the heat generating unit, the cooling unit comprising:
    a cooling fan to generate air flow;
    a duct which is coupled with the casing and forms a cooling path to cool the heat generating unit such that the air flow generated by the cooling fan does not enter the inner space;
    an inlet portion which is provided to one side of the casing to communicate with the duct;
    an inlet grill which is provided in the inlet portion to guide air to be inhaled in a direction inclined to a rear surface of the casing;
    an outlet portion which is provided to an other side of the casing to communicate with the duct, being spaced from the inlet portion;
    an outlet grill which is provided in the outlet portion to guide air to be exhaled in a direction inclined to the rear surface of the casing; and
    a heat transfer unit which is coupled with the heat generating unit and the duct and transfers the heat from the heat generating unit to the duct,
    wherein the exhaled direction provided by the outlet grill is different from the air-inhaling direction provided by the inlet grill.

2. The cooling unit according to claim 1, wherein an inclination angle between the inlet grill and the rear surface of the casing is within a range of 40° to 50° to inhale air from an outside to an inside of the casing in an upward inclined direction, and an inclination angle between the outlet grill and the rear surface of the casing is within a range of 40° to 50° to exhale air from the inside to the outside of the casing in an upward inclined direction.

3. The cooling unit according to claim 1, wherein the heat transfer unit comprises:
a contact member which is coupled with the heat generating unit to transfer the heat from the heat generating unit; and a heat radiating member which is coupled with the contact member and is disposed in the duct to radiate the heat from the contact member.

4. The cooling unit according to claim 1, wherein the cooling path of the duct is arranged vertically to the casing, the inlet portion being disposed in a lower portion of the duct, and the outlet portion being disposed in an upper portion of the duct.

5. The cooling unit according to claim 1, wherein the cooling path of the duct is arranged horizontally to the casing, the inlet portion being disposed in one of left and right sides of the duct, and the outlet portion being disposed in an other of the left and the right sides of the duct.

6. A display apparatus, comprising:
a heat generating unit to generate heat;
a display panel to form an image;
a casing having an inner space to accommodate the heat generating unit and the display panel; and
a cooling unit to cool the heat generating unit, the cooling unit comprising:
a cooling fan to generate air flow;
a duct which is coupled with the casing and forms a cooling path to cool the heat generating unit such that the cooling path is separated from the inner space;
an inlet portion which is provided to one side of the casing to communicate with the duct;
an inlet grill which is provided in the inlet portion to guide air to be inhaled in a direction inclined to a rear surface of the casing;
an outlet portion which is provided to an other side of the casing to communicate with the duct, being spaced from the inlet portion;
an outlet grill which is provided in the outlet portion to guide air to be exhaled in a direction inclined to the rear surface of the casing; and
a heat transfer unit which is coupled with the heat generating unit and the duct and transfers the heat from the heat generating unit to the duct,
wherein the exhaled direction provided by the outlet grill is different from the air-inhaling direction provided by the inlet grill.

7. The display apparatus according to claim 6, wherein the heat transfer unit comprises:
a contact member which is coupled with the heat generating unit to transfer the heat from the heat generating unit; and
a heat radiating member which is coupled with the contact member and is disposed in the duct to radiate the heat from the contact member.

8. The display apparatus according to claim 6, wherein the cooling path of the duct is arranged vertically to the casing, the inlet portion being disposed in a lower portion of the duct, and the outlet portion being disposed in an upper portion of the duct.

9. The display apparatus according to claim 6, wherein the cooling path of the duct is arranged horizontally to the casing, the inlet portion being disposed in one of left and right sides of the duct, and the outlet portion being disposed in an other of the left and the right sides of the duct.

10. The display apparatus according to claim 6, wherein the cooing unit is provided in a plurality.

11. The display apparatus according to claim 6, wherein the display apparatus comprises:
a digital information display (DID) having a network function.

12. The display apparatus according to claim 11, wherein the heat generating unit comprises at least one of a CPU and a chip.

13. The display apparatus according to claim 6, wherein the heat generating unit is plurally provided in the inner space of the casing, each having a different heating generating value,
the heat generating unit having a higher heating generating value among the heat generating units is disposed in a lower portion of the display panel, and
the heat generating unit having a lower heating generating value among the heat generating units is disposed in an upper portion of the display panel.

14. A cooling unit usable with a display apparatus including a heat generating unit to generate heat and a casing having an inner space to accommodate the heat generating unit, the cooling unit comprising:
a duct to form a cooling path between an inlet grill and an outlet grill of the casing of the display apparatus;
a heat transfer unit disposed in the duct to transfer heat from the inner space of the casing to the cooling path; and
a cooling fan disposed in the duct to generate airflow along the cooling path,
wherein the outlet grill guides air in a first direction and the inlet grill guides air in a second direction not parallel to the first direction,
the airflow generated by the cooling fan does not enter the inner space, and
the net grill is provided in the casing to guide aft to be inhaled in a direction inclined to a rear surface of the casing.

15. The cooling unit according to claim 14, wherein the duct comprises an opening; and
the heat transfer unit receives the heat from the heat generating unit of the display apparatus through the opening.

16. The cooling unit according to claim 14, wherein the inlet grill and the outlet grill guide air in a direction not parallel with a rear surface of the casing.

17. A display apparatus, comprising:
a display panel unit;
a heat generating unit disposed on the display panel unit, and including at least one of a central processing unit (CPU), a Northbridge, a Southbridge and a printed circuit board (PCB);
a casing having an inner space to accommodate the display panel unit and the heat generating unit; and
a cooling unit including:
a duct to form a cooling path between an inlet grill and an outlet grill of a casing of the display apparatus;
a heat transfer unit disposed in the duct to transfer heat in the cooling path; and
a cooling fan disposed in the duct to generate airflow along the cooling path,
wherein the outlet grill guides air in a first direction and the inlet grill guides air in a second direction not parallel to the first direction, and
wherein the cooling path is separated from the inner space.

18. A cooling unit of a display apparatus including a heat generating unit to generate heat and a casing having an inner space to accommodate the heat generating unit, the cooling unit comprising:

a duct to define a cooling path between an inlet grill and an outlet grill of the display apparatus;

the heat generating unit disposed within the inner space of the display apparatus and connected to the duct such that heat generated by the heat generating unit flows into the cooling path; and a cooling fan disposed in the duct to generate airflow along the cooling path, wherein the cooling path is separated from the inner space of the display apparatus, and the inlet grill is provided in the casing to guide air to be inhaled in a direction inclined to a rear surface of the casing.

* * * * *